United States Patent
Borg et al.

(10) Patent No.: US 10,014,373 B2
(45) Date of Patent: Jul. 3, 2018

(54) FABRICATION OF SEMICONDUCTOR JUNCTIONS

(71) Applicant: International Business Machines Corporation, Armonk, NY (US)

(72) Inventors: Mattias Borg, Rueschlikon (CH); Kirsten Moselund, Rueschlikon (CH); Heinz Schmid, Rueschlikon (CH); Heike Riel, Rueschlikon (CH)

(73) Assignee: International Business Machines Corporation, Armonk, NY (US)

(*) Notice: Subject to any disclaimer, the term of this patent is extended or adjusted under 35 U.S.C. 154(b) by 146 days.

(21) Appl. No.: 14/878,861

(22) Filed: Oct. 8, 2015

(65) Prior Publication Data
US 2017/0104058 A1 Apr. 13, 2017

(51) Int. Cl.
*H01L 29/06* (2006.01)
*H01L 29/66* (2006.01)
*H01L 21/02* (2006.01)

(52) U.S. Cl.
CPC ...... *H01L 29/068* (2013.01); *H01L 21/02636* (2013.01); *H01L 29/66431* (2013.01); *H01L 29/66462* (2013.01); *H01L 29/66545* (2013.01)

(58) Field of Classification Search
CPC ............ H01L 29/068; H01L 21/02636; H01L 29/66545; H01L 29/66431; H01L 29/66462
See application file for complete search history.

(56) References Cited

U.S. PATENT DOCUMENTS

| | | | |
|---|---|---|---|
| 7,589,347 B2 | 9/2009 | Nash et al. | |
| 7,696,097 B2* | 4/2010 | Lee | B82Y 10/00 257/37 |
| 7,999,251 B2* | 8/2011 | Chu | B82Y 10/00 257/29 |
| 8,153,494 B2* | 4/2012 | Chu | B82Y 10/00 257/E21.404 |
| 8,455,946 B2 | 6/2013 | Lin et al. | |
| 8,558,219 B2* | 10/2013 | Bangsaruntip | H01L 29/42392 257/29 |
| 8,846,503 B1 | 9/2014 | Lee et al. | |

(Continued)

FOREIGN PATENT DOCUMENTS

WO WO 20141144698 A2 9/2014

OTHER PUBLICATIONS

Duan et al., "Lateral epitxial growth of two-dimensional layered semiconductor heterojunctions", Nature Nanotechnology 9, published online 28 Sep. 2014, retrieved online at http://www.nature.com/nnano/journal/v9/n12/full/nnano.2014.222.html, pp. 1-5.

*Primary Examiner* — Latanya N Crawford
(74) *Attorney, Agent, or Firm* — Scully, Scott, Murphy & Presser, P.C.; Daniel Morris, Esq.

(57) ABSTRACT

Methods are provided for fabricating a semiconductor junction. A first semiconductor structure is selectively grown in a nanotube, which extends laterally over a substrate, from a seed extending within the nanotube. The seed is removed to expose the first semiconductor structure and create a cavity in the nanotube. A second semiconductor structure is selectively grown in the cavity from the first semiconductor structure, thereby forming a semiconductor junction between the first and second structures.

11 Claims, 10 Drawing Sheets

(56) References Cited

U.S. PATENT DOCUMENTS

| | | | |
|---|---|---|---|
| 8,853,745 B2 | 10/2014 | Tabatabaie et al. | |
| 2004/0232426 A1* | 11/2004 | Graham | B82Y 10/00 257/77 |
| 2006/0292870 A1* | 12/2006 | Pribat | B01J 21/04 438/680 |
| 2007/0017439 A1* | 1/2007 | Xianyu | C30B 25/005 117/108 |
| 2007/0145482 A1* | 6/2007 | Park | H01L 29/7869 257/347 |
| 2009/0057653 A1* | 3/2009 | Lee | B82Y 10/00 257/37 |
| 2009/0311835 A1* | 12/2009 | Chu | B82Y 10/00 438/151 |
| 2013/0178019 A1* | 7/2013 | Bangsaruntip | H01L 29/42392 438/149 |
| 2016/0155798 A1* | 6/2016 | Borg | H01L 21/02381 257/618 |
| 2016/0351391 A1* | 12/2016 | Borg | H01L 21/02546 |
| 2017/0170271 A1* | 6/2017 | Borg | H01L 29/0688 |

\* cited by examiner

FABRICATION OF SEMICONDUCTOR JUNCTIONS

BACKGROUND

The present invention relates generally to fabrication of semiconductor junctions, and more particularly to fabrication of such junctions by semiconductor growth in nanotubes.

SUMMARY

According to at least one embodiment of the present invention there is provided a method for fabricating a semiconductor junction. The method includes selectively growing a first semiconductor structure in a nanotube, which extends laterally over a substrate, from a seed extending within the nanotube. The seed is removed to expose the first semiconductor structure and create a cavity in the nanotube. A second semiconductor structure is selectively grown in the cavity from the first semiconductor structure, thus forming a semiconductor junction between the first and second structures.

Embodiments of the invention will be described in more detail below, by way of illustrative and non-limiting example, with reference to the accompanying drawings.

DETAILED DESCRIPTION

Figure 1A:
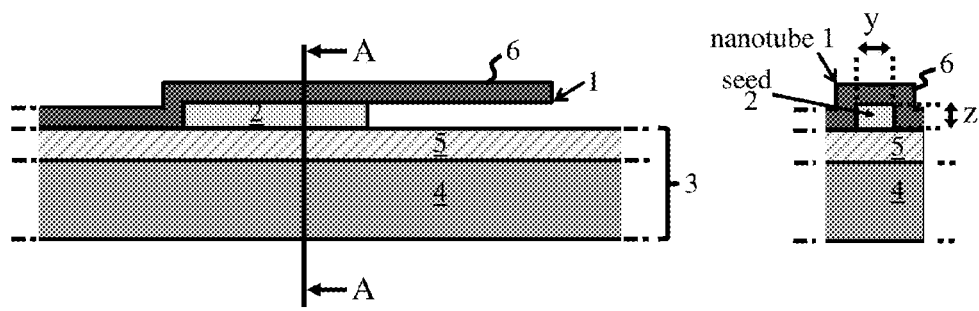
FIGS. 1a through 1d are schematic illustrations showing successive stages in a fabrication method embodying the invention.

Steps of a fabrication process embodying the invention will be described with reference to FIGS. 1a through 1d. The left-hand diagram in FIG. 1a is a schematic cross-sectional view of a structure used in the fabrication method of this embodiment. The right-hand diagram in the figure shows a schematic cross-section on A-A of the left-hand diagram. The structure shown comprises a nanotube 1, containing a seed 2, formed on a substrate 3. The substrate 3 comprises a semiconductor wafer 4 having an overlying material layer 5, typically a dielectric layer, thereon. In this preferred embodiment, material layer 5 comprises a dielectric layer, e.g. of semiconductor oxide or nitride. The seed 2 comprises an elongate formation, typically of semiconductor material, on the dielectric layer 5 of substrate 3. The nanotube 1 comprises a second material layer, typically a dielectric layer, 6. In this example, material layer 6 comprises a second dielectric layer, e.g. of semiconductor oxide or nitride, which together with first dielectric layer 5 of the substrate defines an elongate tunnel containing the seed 2. The nanotube 1 thus extends laterally over the substrate (where the term "laterally" is used in this context, as is customary in the art, to indicate orientation generally parallel to the plane of the substrate as opposed to generally vertically, or outwardly, from the substrate surface). The seed 2 extends within the nanotube 1, occupying part of the length of the tunnel. This tunnel defines a template for formation of semiconductor structures in the following process. The dimensions of the tunnel thus determine the dimensions of the structures to be formed. In the simple example of FIG. 1a, the interior of nanotube 1 has a uniform rectangular cross-section of substantially equal width y, z in lateral and perpendicular directions relative to the substrate. In general, however, the nanotube may have any desired cross-sectional shape, including rounded, e.g. circular, or other rectangular shapes. The cross-sectional geometry may also vary along the nanotube length as illustrated by examples below.

A first step of the junction fabrication process comprises selectively growing a first semiconductor structure in the nanotube 1 from the seed 2. This can be achieved by epitaxial growth of the semiconductor material via the opening at the end of the nanotube, e.g. using a process such as metal-organic vapor phase deposition (MOCVD), migration enhanced epitaxy (MEE), or hydride vapor phase epitaxy. While in general the first semiconductor structure may comprise any desired semiconductor material, in preferred embodiments the first structure comprises a compound semiconductor material such as a III-V semiconductor or a II-VI semiconductor for example. The nanotube 1 is thus epitaxially filled by the compound semiconductor from the exposed surface of seed 2 in the tunnel. To inhibit formation of defects extending from the junction, the nanotube 1 is preferably shaped such that the exposed surface of the seed has an area of order $10^4$ nm$^2$ or less, preferably less than $2\times10^4$ nm$^2$, and most preferably less than $10^4$ nm$^2$.

Figure 1B:
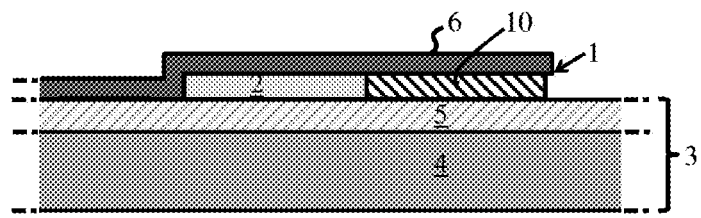

The result of the first growth step is shown in FIG. 1b where the first structure 10 is grown to substantially the full extent of the tunnel from seed 2. As is well-known in the art for such selective growth processes, the material of seed 2 is selected according to the semiconductor material of the structure to be grown so that the seed efficiently induces nucleation of the growing crystal. The material defining the nanotube is selected to have a low sticking coefficient, and hence low nucleation probability, for the semiconductor material of the structure to be grown. In preferred embodiments, the seed comprises a monocrystalline semiconductor, conveniently silicon, and nanotube 1 is formed by insulating material. In particular, each dielectric layer 5, 6 in FIG. 1 may comprise a layer of oxide, such as silicon oxide, or silicon nitride for example.

Figure 1C:
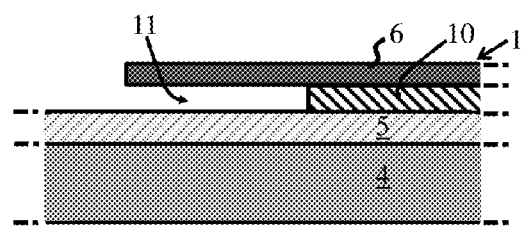

Following growth of the first structure 10, the seed 2 is removed to expose the first structure and create a cavity 11 in the nanotube as shown in FIG. 1c. This can be achieved via lithographic patterning, e.g. by photolithography or electron-beam lithography, to define regions to be removed and then selective removal of the desired materials, e.g. by wet or dry etching. The end of nanotube 1 is thus opened by partial removal of material layer 6 to expose seed 2, and the seed material is etched away to expose the end surface of first structure 10 in the resulting cavity 11.

Figure 1D:
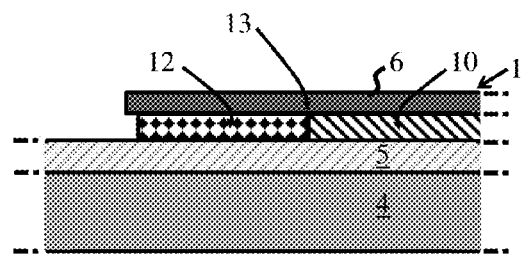

In a subsequent step of the fabrication process, a second semiconductor structure 12 is selectively grown in the cavity 11 from first structure 10 as shown in FIG. 1*d*. The first structure 10 thus provides the seed for growth of second structure 12 which can be achieved by epitaxial growth of the semiconductor material of the second structure as described above. The result of this step is formation a semiconductor junction 13 between the first and second structures 10, 12. The nature of this junction depends on the particular semiconductor materials of the first and second structures. In preferred embodiments, the second structure also comprises a compound semiconductor material. In particular, a semiconductor heterojunction can be formed between structures of different compound semiconductor materials. Alternatively, for example, a p-n junction or homojunction may be formed between first and second structures comprising the same compound semiconductor material but with different doping. In general, however, junctions may be formed between structures of any desired semiconductor materials. Also, material composition and/or dopant levels may be varied during the growth processes if desired.

The above process allows controlled fabrication of lateral semiconductor junctions. For example, junction position is dependent on location of the end of seed 2 in nanotube 1. This can be precisely controlled in the fabrication process, providing semiconductor junctions at well-defined lateral positions. This offers accuracy in device fabrication, enabling improved construction and enhancement of device characteristics.

If desired in the above process, the selective growth conditions can be determined such that epitaxial growth proceeds from a single nucleation point on the seed surface. This suppresses crystal defects in the resulting structure. Nucleation at the seed surface depends on the seed surface area and the mobility of atoms diffusing over the seed surface during the deposition process. If the dimensions y, z of the seed surface are considerably less than the average diffusion length of the atoms at the operating temperature of the process, then growth from a single nucleation point can be obtained. Precise constraints on the seed surface area will thus vary for individual processes depending on the particular materials and process parameters, but suitable values in a given scenario will be readily determined by those skilled in the art.

While exemplary materials are indicated above, the seed and nanotube may be formed of a variety of materials in other embodiments. The seed 2 may comprise monocrystalline semiconductors other than silicon, e.g. germanium, silicon-germanium or germanium-tin, and embodiments might be envisaged in which the seed comprises an amorphous or polycrystalline semiconductor or a metal or metal-semiconductor alloy such as a metal silicide. If the seed has a well-defined crystalline orientation and if the crystal structure of the seed is a reasonable match to that of the growing crystal (for example Silicon and III-V compound semiconductors), the growing crystal can adapt this orientation. If the seed is amorphous or has an undefined crystal orientation, the growing crystal will be single crystalline but its crystal orientation will be random. Nanotube 1 may also comprise other materials, e.g. other dielectric materials, which suppress deposition of the semiconductor on the nanotube interior during nanowire growth. In general, the nanotube may comprise one or more materials. In some embodiments, the nanotube may be (wholly or partially) defined by non-reactive surfaces such as oxidized surfaces of metals.

Figure 2A:
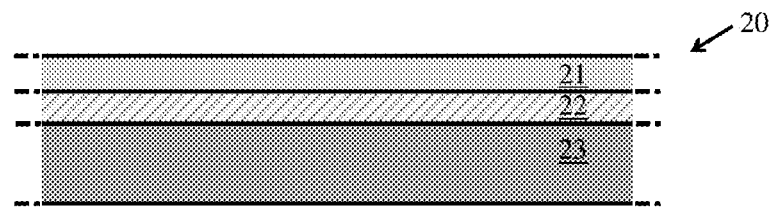
FIG. 2a through 2j are schematic illustrations showing more detailed stages in a fabrication method embodying the invention.
Figure 2B:
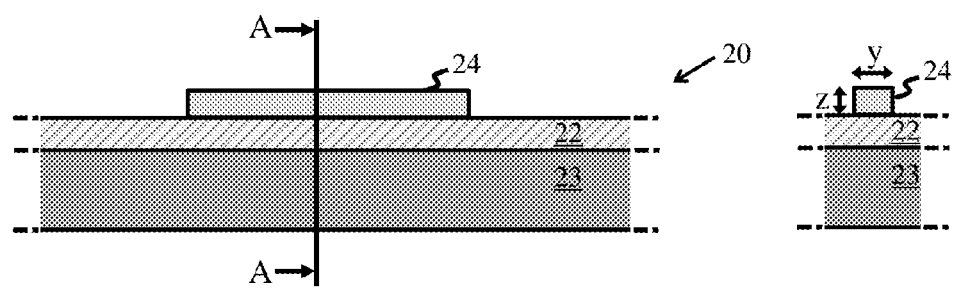

An exemplary fabrication method embodying the invention will now be described in more detail with reference to FIGS. 2*a* through 2*j*. FIG. 2*a* is a schematic cross-section through a SOI (Silicon On Insulator) wafer 20 which provides the substrate for this fabrication process. Wafer 20 comprises three layers. A thin, typically 10-200 nm thick, Si device layer 21 is bonded or deposited on a silicon oxide dielectric layer 22 which in turn overlies a thick silicon handle wafer 23. The Si device layer 21 with (100) surface orientation provides a seed material layer for the ensuing fabrication process. In a first stage of the process, this Si layer 21 is patterned to form a silicon nanowire 24 as shown in FIG. 2*b*. Nanowire 24 provides the seed material which is shaped to define the interior of the nanotube to be formed in subsequent steps. This initial patterning step exposes the dielectric layer 22 around nanowire 24 and may involve reducing the thickness of device layer 21 according to the desired dimensions of the nanotube to be formed. The resulting nanowire of seed material 24 thus projects from dielectric layer 22. In this simple example, the nanowire 24 is of uniform rectangular cross-section as illustrated on the right-hand side of FIG. 2*b* which shows a schematic cross-section on A-A of the left-hand view in the figure. Each of dimensions y, z in this example may be less than 100 nm.

Figure 2C:
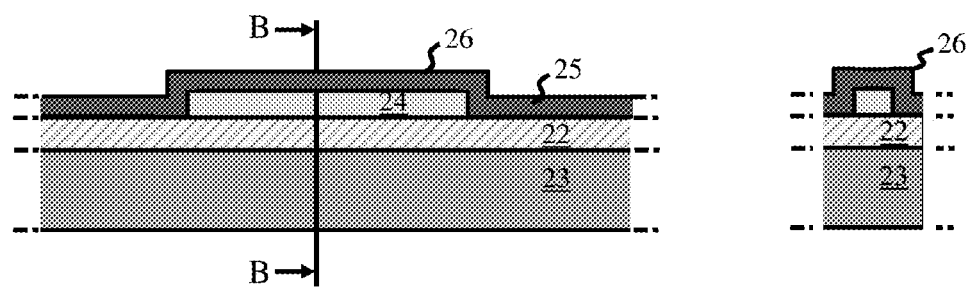

In a second step of the fabrication process, a second dielectric layer 25, e.g. of silicon oxide, is deposited over, and in contact with, the seed material 24 and the first dielectric layer 22. The result of this step is illustrated in FIG. 2*c*, where the right-hand view shows a cross-section on B-B of the left-hand view in the figure. The first and second dielectric layers 22, 25 together define a nanotube 26 around the seed material 24.

Figure 2D:
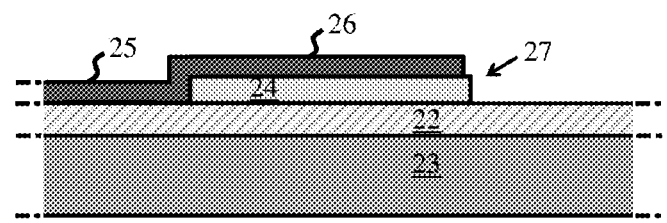
Figure 2E:
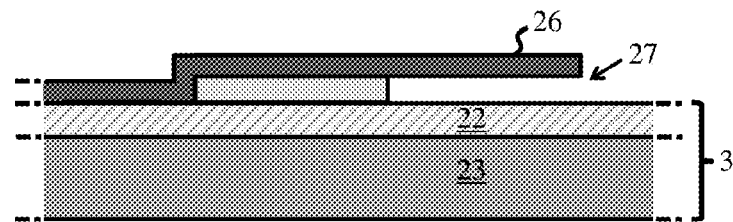

Next, as illustrated in FIG. 2*d*, an opening 27 is formed in a first end of the nanotube 26, e.g. by lithographic processing, to expose the seed material 24. A first portion of the seed material 24 is then etched away via the opening 27, e.g. by $XeF_2$ vapor, high-temperature HCL vapor etching, or wet-etching in a suitable etchant. This stage is illustrated in FIG. 2*e*. The remaining portion of seed material 24 provides the Si seed 28 for subsequent growth of a first semiconductor nanowire. The surface orientation of the exposed seed surface can be well tailored by choosing the crystal orientation of the seed material and the wet etchant. If the surface orientation of the seed material is along (110), vertical (111) seed surfaces can be obtained, while for more common (100) surface orientation the (111) seed surface will be inclined.

Figure 2F:
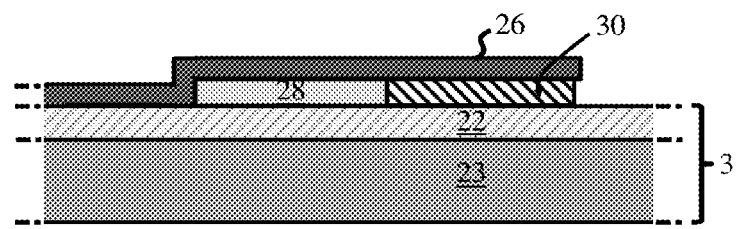
Figure 2G:
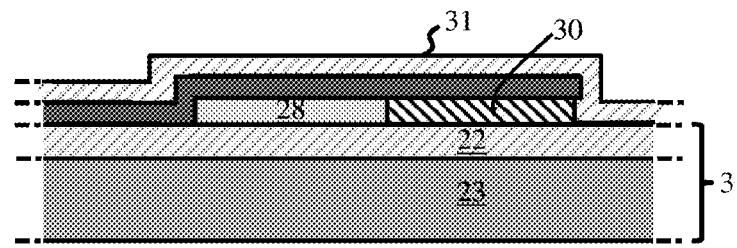
Figure 2H:
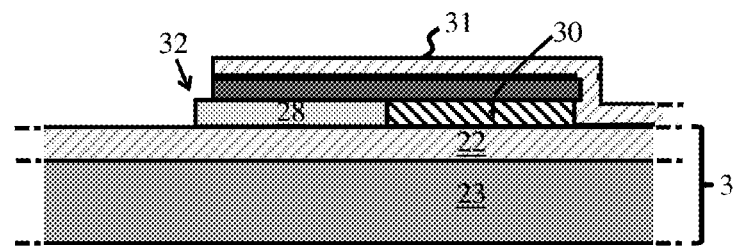
Figure 2I:
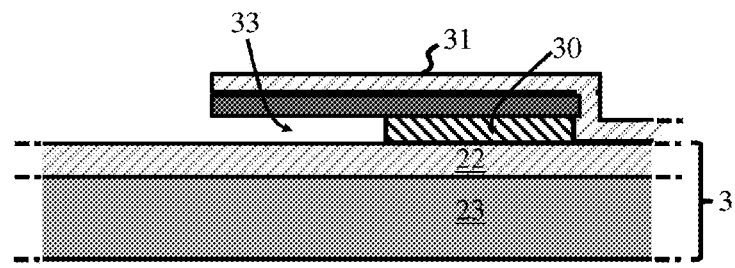
Figure 2J:
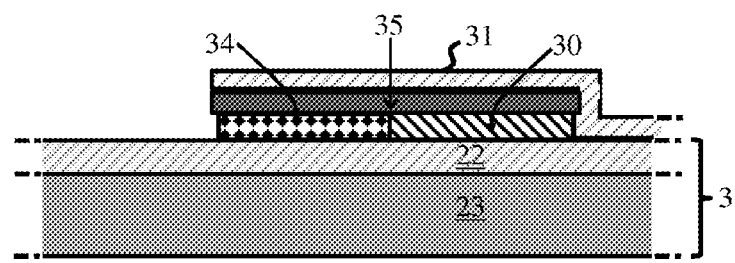

Prior to the first selective growth step, the Si seed surface in nanotube 26 is preferably cleaned, by flushing with an HF dip, to remove any surface oxidation. A first III-V semiconductor nanowire 30, e.g. of InAs, is then selectively grown in nanotube 26 from the Si seed 28 as described above. The resulting structure is shown in FIG. 2*f*. Next, the opening 27 in the first end of nanotube 26, remote from seed 28, is closed by depositing a dielectric material 31, e.g. a layer of oxide such as silicon oxide, by atomic layer deposition as shown in FIG. 2*g*. This step serves to enclose the first nanowire 30, protecting it from subsequent processing steps. Next, an opening 32 is formed in the other end of nanotube 26, e.g. by lithographic processing to remove portions of layers 25, 31 and expose an end of the seed 28. This is illustrated in FIG. 2*h*. The Si seed 28 is then selectively etched, e.g. by $XeF_2$ vapor or wet-etching in a suitable etchant, to create a cavity 33 in nanotube 26, and expose the end of first nanowire 30, as shown in FIG. 2*i*. If desired at this stage, a surface layer, e.g. up to 10 nm, of the end of nanowire 30 adjacent the cavity, i.e. the end exposed by removal of the seed, may be removed. This can be achieved, for example, by wet etching with a suitable etchant, such as a citric acid and hydrogen peroxide mixture for InAs. A so-called "digital etching" process may also be employed here. This comprises two separate steps: oxidizing the surface in an oxygen plasma, and removal of the surface oxide in sulphuric acid. These steps can be cyclically repeated multiple times to control the etch depth. Removal of this surface layer removes any defects which may have occurred at the Si/III-V interface of nanowire 30. Next, a second III-V semiconductor nanowire 34, e.g. of GaSb, is selectively grown in the cavity 33 using the exposed surface of first nanowire 30 as a seed for nucleation. A heterojunction 35 is thus formed between the III-V nanowires as shown in FIG. 2j.

After formation of the heterojunction, the overlying material layers 25, 31 may be removed if required, e.g. by etching, to expose the nanowires on substrate wafer 1. The structure may then be optimized if desired, e.g. to refine shape, and subsequent device processing steps may be performed as appropriate to build a required device structure around the heterojunction.

The basic fabrication steps described above can be performed using well-known material processing techniques. By way of illustration, details of an exemplary process for fabricating an InAs—GaSb nanowire heterojunction on an SOI wafer are described in the following. An SOI wafer with a 17 nm device layer was processed to form the seed material nanowire 24 of FIG. 2b by electron beam lithography and reactive ion etching. The nanowire 24 had a length of 2 μm and dimensions y=25 nm and z=20 nm. A dielectric layer 25 of $SiO_2$ was deposited to a thickness of 100 nm by plasma-enhanced chemical vapour deposition. Opening 27 was formed by electron beam lithography and the seed material was partially removed by a tetramethylammonium hydroxide wet etch to leave the seed 28 as shown in FIG. 2e. The seed 28 had a length of 0.7 μm. The InAs nanowire 30 was then grown by MOCVD using the precursors tertiary-butylarsenic and trimethylindium at a molar flow ratio of 222/2 μMol/min=80 at a temperature of 580° C. This produced a first nanowire of approximate length 650 nm. A layer 31 of silicon dioxide was deposited by atomic layer deposition to close the nanotube (FIG. 2g), and opening 32 was formed using a PMMA resist and electron beam lithography to expose the seed 28. The Si seed was selectively etched by $XeF_2$ vapor to create cavity 33 and expose InAs nanowire 30 in the nanotube 26. Misfits at the Si/III-V interface were removed by a short (10 nm) III-V wet etch in citric acid:$H_2O_2$ (1:10). The GaSb nanowire 34 was then grown by MOCVD using the precursors trimethyantimony and trimethylgallium at a molar flow ratio of 10.6/24 μMol/min=0.4 at a temperature of 550° C. This produced a second nanowire of length 200 to 250 nm.

Figure 3A:
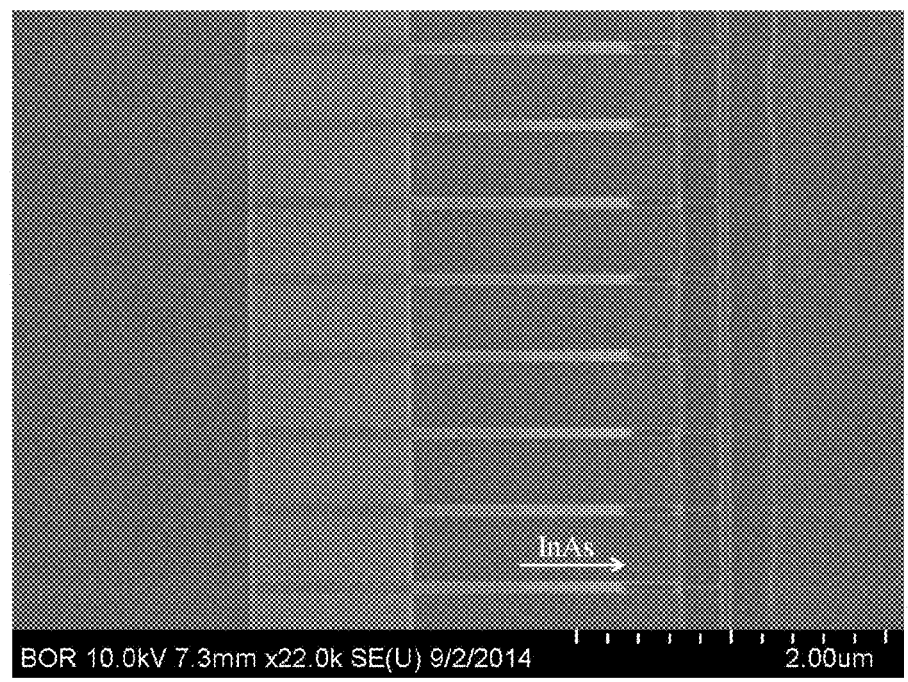
FIGS. 3a through 3c are images of different growth stages in fabrication of semiconductor junctions by a method embodying the invention.
Figure 3B:
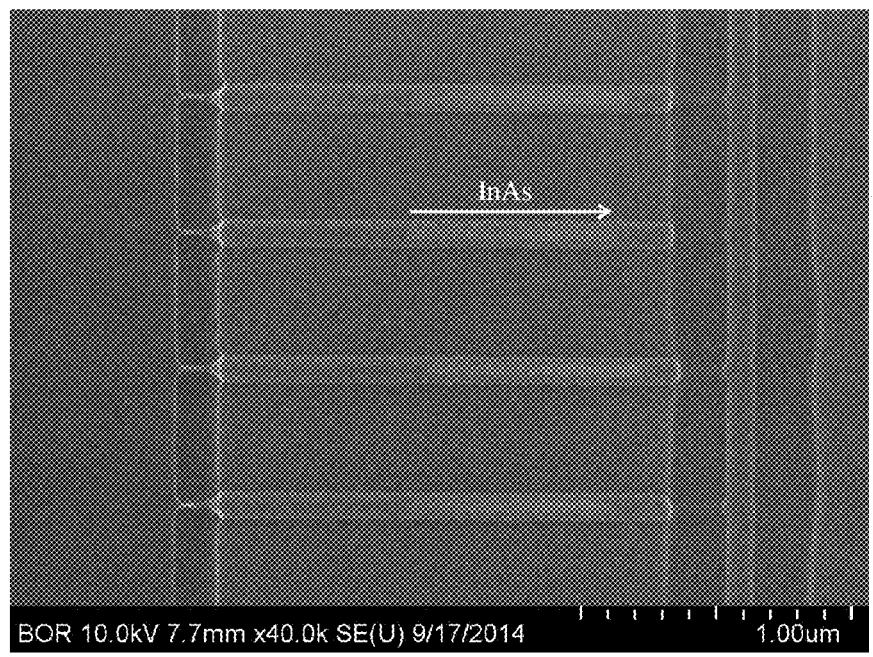
Figure 3C:
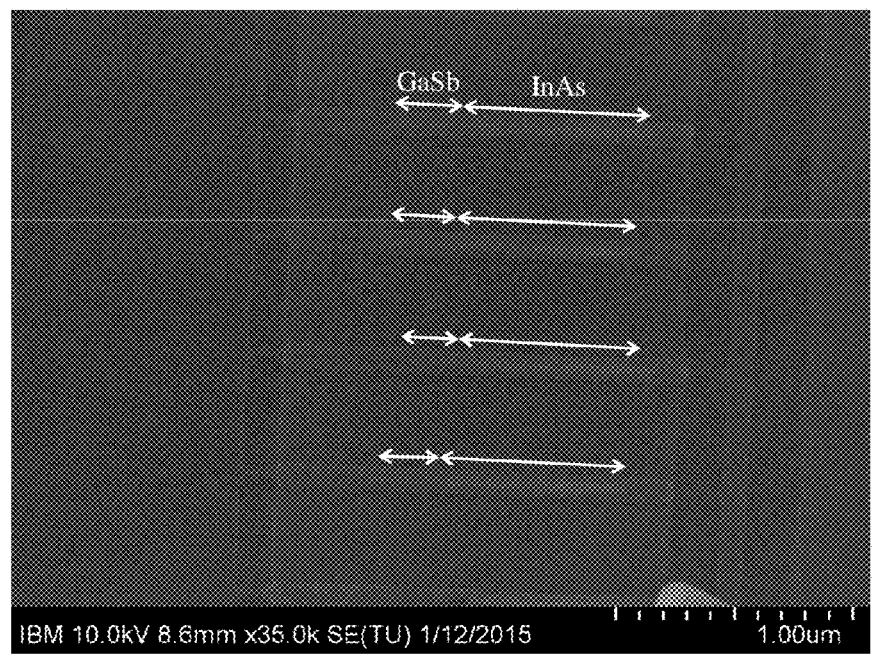
Figure 4A:
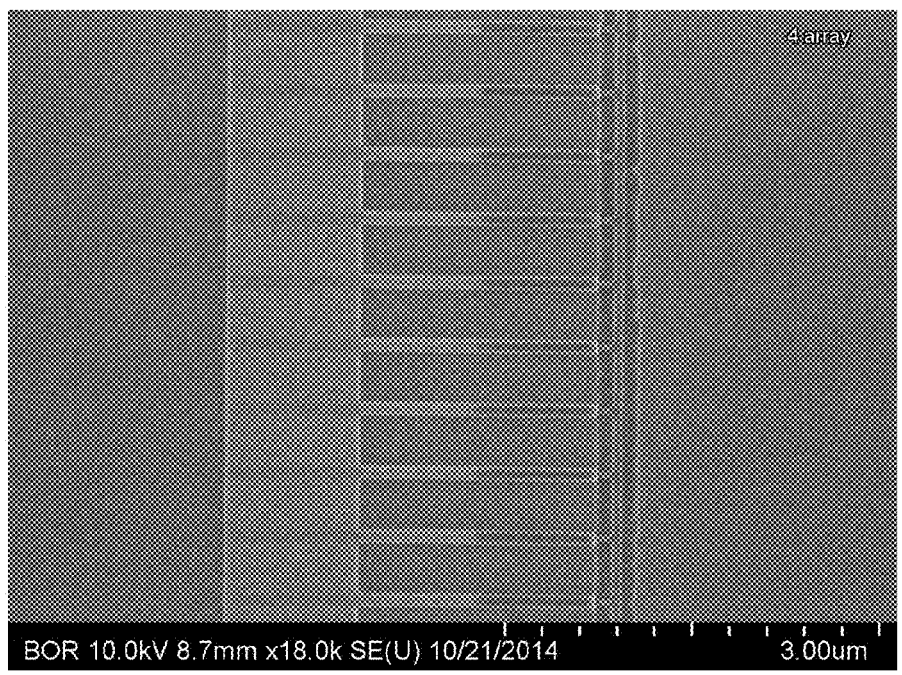
FIGS. 4a and 4b are images showing results of precise etch control in a fabrication method embodying the invention.
Figure 4B:
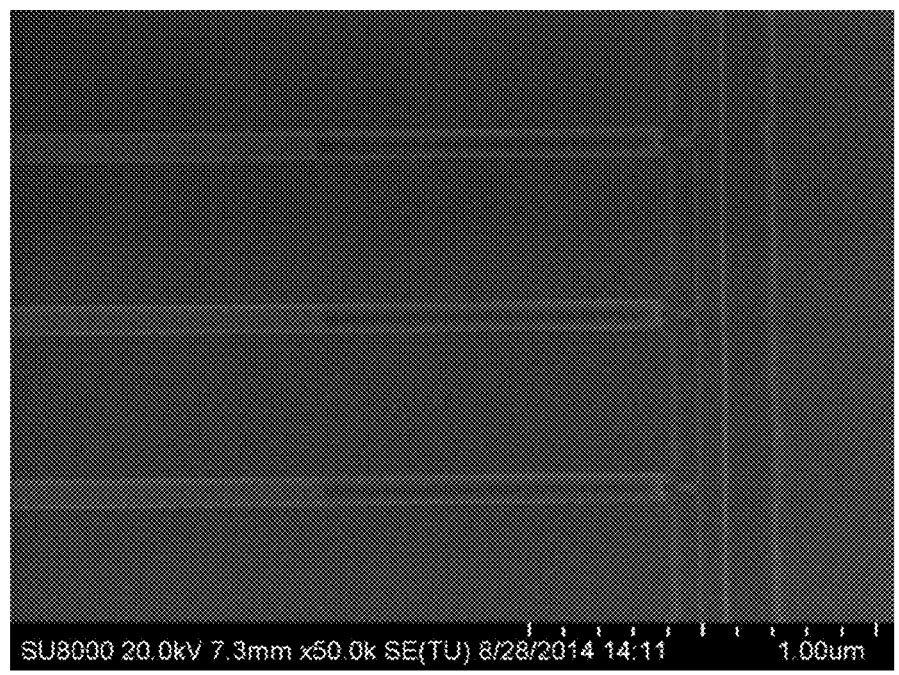

FIGS. 3a through 3c are high-resolution images of successive stages in fabrication of a linear array of nanowire heterojunctions via the process of FIGS. 2a through 2j. FIG. 3a shows the InAs nanowires grown from Si seeds in the nanotubes. FIG. 3b shows the nanotubes after removal of the Si seeds. FIG. 3c shoes the nanotubes with GaSb nanowires grown from the InAs nanowires as seed material for second nanowire growth. These images demonstrate successful heterojunction formation. The lateral heterojunction positions were reasonably well-aligned in this process even without precise control of the initial Si etch defining the seeds for first nanowire growth. However, this process can be very precisely controlled by careful control of the etchant temperature and etching time. In this way, the Si seed surfaces for the first nanowire growth step can be very precisely positioned. This is demonstrated by the image of FIG. 4a, and enlargement of FIG. 4b, which show the results of such a controlled-etch process. The lateral heterojunction position, which is dependent on this etch process, can thus be determined with high precision. The additional III-V etch to remove interface defects (where performed) can be similarly controlled with a high degree of accuracy. For example, this etch process can be precisely controlled by digital etching, as described earlier, to give accuracy down to the monolayer level. In addition, the junction morphology can be conveniently controlled here by using an isotropic or anisotropic III-V etch to etch desired crystal planes and shape the remaining surface.

The above process also allows down-scaling of nanowire diameters resulting from the second nanowire growth step. With a Si seed 28, the HF dip (which is desirably used to clean the seed surface prior to first nanowire growth) can cause slight expansion, e.g. 3-5 nm, of the diameter of the interior of nanotube 26. This inhibits scaling of the first nanowire diameter below 10 nm. However, by growing the second nanowire from the first in the cavity formed by removal of the seed, the diameter of the second nanowire is unaffected by the HF dip. This offers well-defined diameters for the second nanowire and allows scaling below 10 nm. The second nanowire may, for example, form the channel of an FET device, whereby FETS with reduced channel diameters can be readily fabricated on silicon wafers.

Figure 5A:
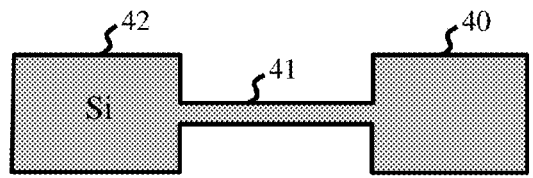
FIGS. 5a through 5c are schematic illustrations showing stages in fabrication of a heterojunction between structures with sections of differing width.
Figure 5B:
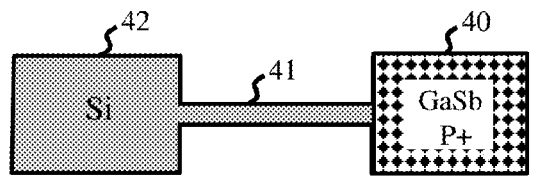
Figure 5C:
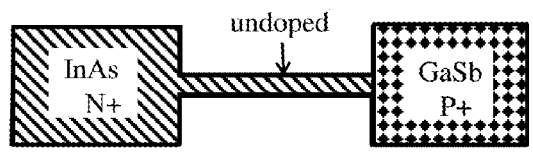

The initial seed material structure 24 (FIG. 2b) defining the interior of the nanotube can be shaped into sections of differing width (lateral or perpendicular to the substrate) along its extent if desired for a particular device structure. Moreover, the different widths may be exploited to provide a natural etch stop, facilitating control of junction position. By way of example, FIG. 5a is a schematic plan view of an exemplary Si seed material shape. This has a first section 40 of greater lateral width than an adjoining section 41, which is connected in turn to a further section 42 of greater width than adjoining section 41. The first section 40 can be etched back in the initial Si etch step of FIG. 2e. The reduction in diameter at the junction with section 41 provides a natural etch stop because etching can be slower in narrower tubes. The first etch-back can thus be "self-terminating", providing further control of junction position. The remaining portion (sections 41 and 42) of the seed material then form the seed 28 for growth of the first semiconductor structure. As illustration, FIG. 5b indicates a P+ doped GaSb structure grown in place of section 40. FIG. 5c shows a second structure of N+ InAs grown from the first structure after Si seed removal. As indicated here, the dopant level is changed during growth of the second structure such that the portion replacing narrow section 41 is undoped, and that replacing wider portion 42 is N+ doped. The undoped narrow portion of the second structure can form a nanowire channel of a heterojunction FET, with the wider portions of the structures forming the source and drain contact regions of the FET. The junction position is thus well-defined, and the channel can be scaled below 10 nm if desired, offering improved device performance.

Figure 6:
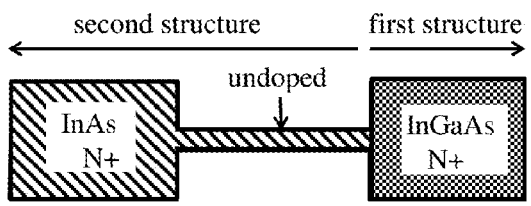
FIGS. 6 and 7 illustrate formation of other heterojunction structures.
Figure 7:
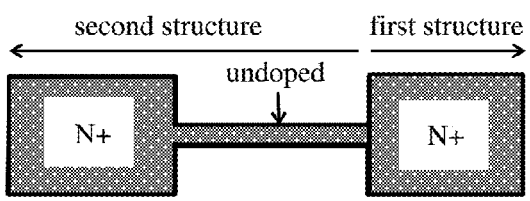

FIGS. 6 and 7 illustrate further examples of heterojunction structures formed by the above process. FIG. 6 shows a first structure of N+ doped InGaAs, and a second structure of InAs which has an undoped channel region and an N+ doped contact region. This arrangement may form the basis of heterojunction MOSFET. These devices are of importance for demonstrating improved breakdown voltages and improved off-characteristics in narrow bandgap semiconductor devices. The FIG. 7 arrangement provides the basis for a low-access resistance MOSFET. This comprises a first structure of an N+ doped compound semiconductor, and a second structure of the same compound semiconductor but having an undoped channel region and an N+ doped contact region. Numerous other examples are of course possible. Dimensions in these figures are schematic only and can be adapted in practice to device requirements.

Figure 8A:
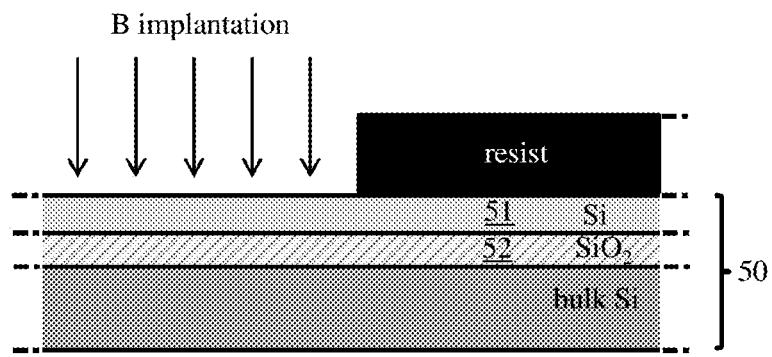
FIGS. 8a through 8f illustrate successive stages in a further fabrication method embodying the invention.
Figure 8B:
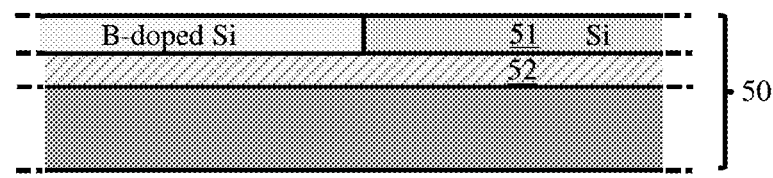
Figure 8C:
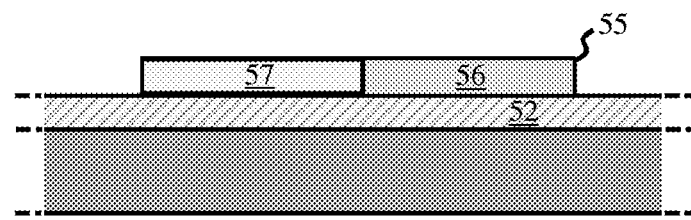
Figure 8D:
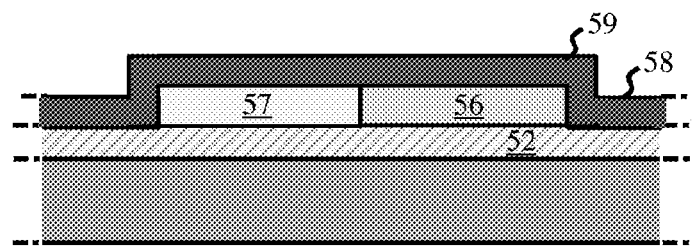
Figure 8E:
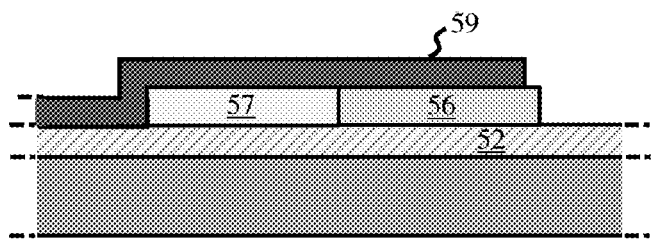
Figure 8F:
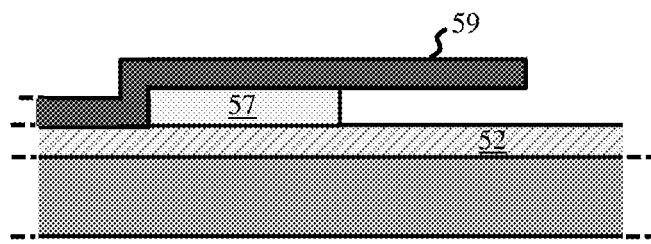
Figure 9:
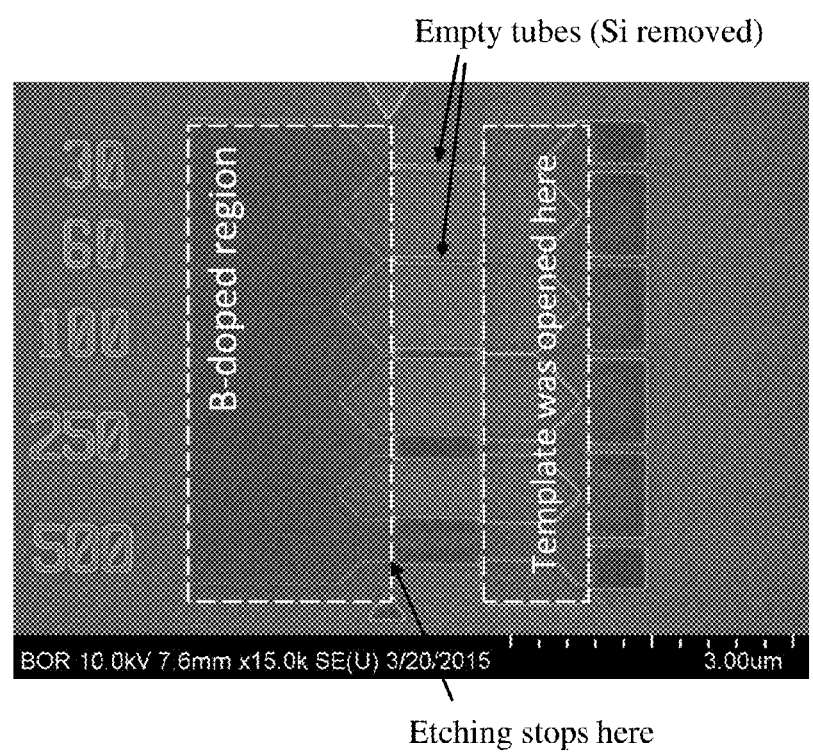
FIG. 9 is an image showing precise etch control achieved via a doping technique used in the further fabrication method.

FIGS. 8a through 8f illustrate successive stages in a further fabrication method embodying the invention. FIG. 8a is a schematic cross-section through a SOI wafer 50 in which the Si device layer 51, overlying dielectric layer 52 of silicon oxide, provides the seed material layer for the fabrication process. In this process, prior to depositing the second dielectric layer to form the nanotube, a portion of the Si seed material is doped to produce a doped portion which is resistant to a predetermined etchant. In general, doping may be performed before or after patterning the seed material layer. In this example, the doping is performed prior to patterning of the seed material as illustrated in FIG. 1a. A layer of resist is deposited over part of Si layer 51, and the exposed portion is then doped by ion implantation. Boron-doping is used in this embodiment as B-doped silicon is resistant to etching in tetramethylammonium hydroxide. The resist is then removed, and dopant activation is performed by a high temperature anneal (typically 700 to 1000 degrees Celsius), to leave a B-doped Si region as shown in FIG. 8b. The Si layer 51 is then patterned to produce a seed material nanowire 55 as shown in FIG. 8c. Nanowire 55 has a first, undoped portion 56 and a B-doped portion 57. As shown in FIG. 8d, a second dielectric layer 58, e.g. of silicon oxide, is then deposited to define nanotube 59 around the seed material nanowire 55. A first end of the nanotube is then opened to expose the undoped portion 56 of nanowire 55 as shown in FIG. 8e. The undoped portion 56 is then etched away by a tetramethylammonium hydroxide etch to leave the B-doped portion 57 in nanotube 59 as a seed for growth of the first nanowire. This is shown in FIG. 8f. A natural etch stop is thus provided at the B-doped seed in this embodiment, further facilitating positional control for the junction to be formed at this location. Effectiveness of this etch-stop technique is demonstrated in the image of FIG. 9. This shows the result of etching undoped silicon nanowires, in nanotubes of differing widths, following opening of the nanotube templates at one end. The silicon nanowires extend from a bulk B-doped Si region indicated in the figure. Etching stopped precisely at the junction with this B-doped region in all cases.

Further processing stages after FIG. 8f can be generally as before, with removal of the B-doped Si seed 57 being performed by a XeF$_2$ vapor etch at the appropriate stage. By shaping of the seed material 55, the structure can also be shaped into sections of differing width as described earlier.

Figure 10A:
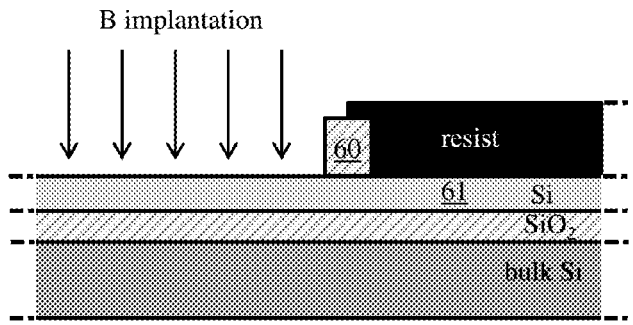
FIGS. 10a through 10e illustrate stages in another fabrication method embodying the invention.
Figure 10B:
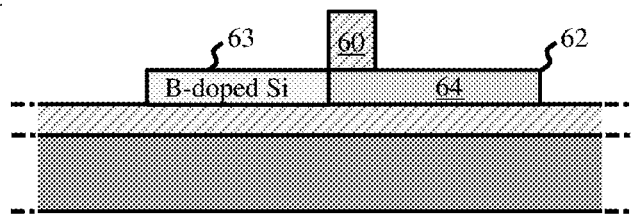
Figure 10C:
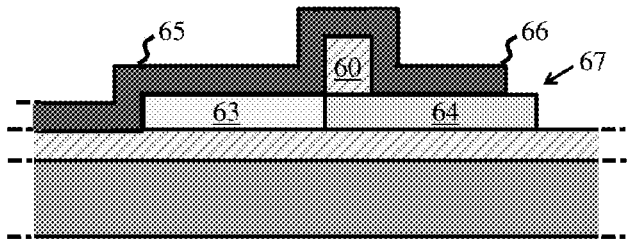
Figure 10D:
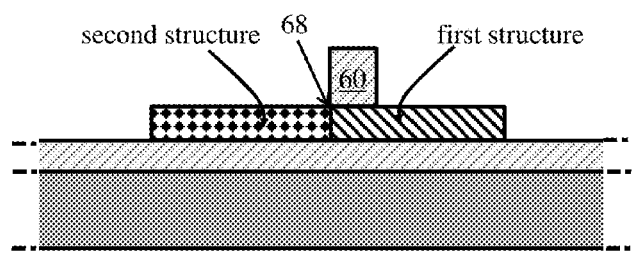
Figure 10E:
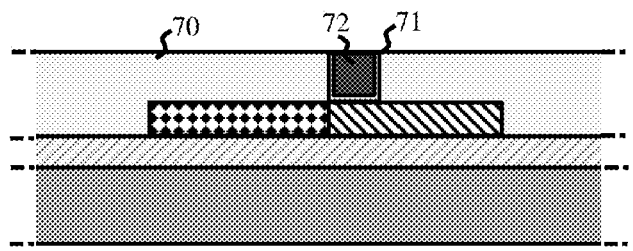

FIGS. 10a through 10e illustrate stages in another fabrication method using B-doping of the seed material. In this process, prior to depositing the second dielectric layer to form the nanotube around the seed material nanowire, a placeholder for a MOS replacement gate stack (referred to as a "dummy gate" herein) is provided in contact with the seed material. The dummy gate covers a section of the seed material remote from the ends of the nanowire. Doping is performed such that the doped portion of the seed material nanowire extends between the dummy gate and one end of the seed material nanowire. In this example, the dummy gate is formed prior to patterning the seed material layer. FIG. 10a shows the dummy gate 60 formed on Si seed material layer 61 of a substrate wafer. The dummy gate may be formed, for example, of silicon oxide, silicon nitride, or layers thereof disposed around a silicon region. A layer of resist is formed on the seed material layer 61 on one side of dummy gate 60. B-doping is then performed using the dummy gate and resist layer as a mask. After patterning the Si layer 61 to form seed material nanowire 62 as shown in FIG. 10b, the B-doped portion 63 extends between the dummy gate and one end of the seed material nanowire. The undoped portion 64 is aligned with the edge of dummy gate 60. After depositing a second dielectric layer 65 to define nanotube 66 around the seed material, an opening 67 is formed in a first end of the nanotube to expose the other end of the seed material 62. This stage is shown in FIG. 10c. The undoped portion 64 is then etched away as before to leave the B-doped portion 63 in nanotube 66 as a seed for growth of the first nanowire. A natural etch stop is thus provided at the B-doped seed and at a position aligned with dummy gate 60. After growth of the first and second nanowires as shown in FIG. 10d, the resulting semiconductor junction 68 is thus aligned with the dummy gate. The dummy gate can then be replaced with a true gate structure formed at this location using a standard replacement-gate procedure. For example, the nanowire structure can be masked with a dielectric material 70 which can be thinned by chemical-mechanical polishing to leave dummy gate 60 exposed. The dummy gate can be removed by etching, and a desired gate dielectric 71 and gate electrode 72 can then be deposited in place of the dummy gate and structured to the same height using chemical-mechanical polishing. The end result is indicated schematically in FIG. 10e. The resulting gate structure is then self-aligned to the position of junction 68.

The seed material 62 in the above embodiment may be shaped into sections of differing width as described earlier. In this case, the narrow, channel section of an FET structure (e.g. as in FIGS. 5c, 6 and 7) may form part of the first semiconductor structure grown from seed 63 so that the resulting gate structure is formed over the channel. The doped portion of the seed material may thus have a greater width than an adjoining section of the seed material which occupies the region of the nanotube in which the semiconductor channel is ultimately formed.

While particular examples have been described above, numerous alternatives and modifications can be envisaged. As an example, embodiments may use other substrates as a starting point for processing, such as a GeOI (Germanium-On-Insulator) wafer, or an XOI wafer having any other semiconductor material on insulator. Alternatively, for example, processing may start from a bulk semiconductor wafer, the surface of which is covered with a dielectric material and patterned to define an opening to the substrate from which a semiconductor seed material can be extended over the dielectric material by an epitaxial growth process, e.g. epitaxial lateral overgrowth. The connection between the seed and the substrate can then be severed during the seed structuring process, leaving the seed on the dielectric layer. Fabrication processes embodying the invention may in general commence with plain or pre-patterned substrate wafers, i.e. with the seed material already processed. Various other compound semiconductors may be used in the above processes, and other dopant and etchant combinations may be used to define etch stops. The resulting semiconductor nanowire structures may be further processed if desired, e.g. via additional etching and/or nanowire growth stages to produce more complex structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor junction, the method comprising:
    forming a seed material structure extending laterally on a surface of a first dielectric layer formed on a semiconductor material substrate;
    forming a second dielectric material layer in contact with the seed material and first dielectric layer, the first dielectric and second dielectric layers forming an encasement around the seed material structure, said seed material structure shaped to define an interior of the encasement;
    forming an opening in a first end of the encasement to expose the seed material;
    etching away a first portion of the seed material within said encasement interior via said opening;
    selectively growing a first semiconductor structure in said interior of said encasement from the exposed seed material;
    removing a remaining portion of the seed material to expose the first semiconductor structure and create a cavity in the encasement; and
    selectively growing a second semiconductor structure in the cavity from the exposed first semiconductor structure, thereby forming a semiconductor junction between the first and second structures.

2. The method as claimed in claim 1 wherein the encasement is shaped such that the first semiconductor structure is grown from a surface of the seed having an area of order $10^4$ nm$^2$ or less.

3. The method as claimed in claim 1 including, after growing said first structure, depositing a dielectric material to close a first end of the encasement, remote from the seed, thereby enclosing the first structure.

4. The method as claimed in claim 1 including, after removing the remaining portion of the seed, removing a surface layer, exposed by removal of the seed, of said first semiconductor structure adjacent the cavity.

5. The method as claimed in claim 1 including patterning a seed material layer to form said seed material structure.

6. The method as claimed in claim 1 wherein said seed material comprises silicon.

7. The method as claimed in claim 1 wherein said seed material is shaped into sections along the extent thereof, the sections being of differing width.

8. The method as claimed in claim 7 wherein said seed material is shaped such that said first portion has a greater width than at least an adjoining section of said remaining portion.

9. The method as claimed in claim 8 wherein said remaining portion comprises said adjoining section and a further section of greater width than said adjoining section.

10. The method as claimed in claim 1 wherein each of the first and second semiconductor structures comprises a compound semiconductor material.

11. The method as claimed in claim 10 wherein the first and second semiconductor structures comprise different compound semiconductor materials.

* * * * *